United States Patent
Frambach et al.

(10) Patent No.: US 11,843,388 B2
(45) Date of Patent: Dec. 12, 2023

(54) CAN TRANSMITTER

(71) Applicant: NXP B.V., Eindhoven (NL)

(72) Inventors: Johannes Petrus Antonius Frambach, Nijmegen (NL); Cornelis Klaas Waardenburg, Zeeland (NL); Gerard Arie de Wit, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/647,739

(22) Filed: Jan. 12, 2022

(65) Prior Publication Data
US 2022/0247416 A1 Aug. 4, 2022

(30) Foreign Application Priority Data

Jan. 29, 2021 (EP) .................................. 21154292

(51) Int. Cl.
*H04L 7/00* (2006.01)
*H03L 7/099* (2006.01)
*G11C 7/10* (2006.01)
*G11C 7/16* (2006.01)
*H03L 7/081* (2006.01)
*H03L 7/085* (2006.01)

(52) U.S. Cl.
CPC .......... *H03L 7/0991* (2013.01); *G11C 7/1036* (2013.01); *G11C 7/16* (2013.01); *H03L 7/081* (2013.01); *H03L 7/085* (2013.01)

(58) Field of Classification Search
CPC .......... H04L 7/0091; H04L 7/00; H04L 7/033; H04L 12/40; H04L 12/40013; H04L 67/1095

USPC .................. 375/371, 376; 370/350, 355, 441
See application file for complete search history.

(56) References Cited

U.S. PATENT DOCUMENTS

| | | | |
|---|---|---|---|
| 5,995,555 A | 11/1999 | Young | |
| 8,502,720 B1 | 8/2013 | Wyville | |
| 8,736,475 B1 | 5/2014 | Harrison | |
| 9,502,889 B2 * | 11/2016 | Yang | ........................ H04L 43/08 |
| 10,608,718 B2 * | 3/2020 | van Meurs | ............ H04B 7/0613 |
| 2005/0225464 A1 | 10/2005 | Lin et al. | |
| 2013/0207823 A1 | 8/2013 | Wyville | |

* cited by examiner

*Primary Examiner* — Hai L Nguyen

(57) ABSTRACT

A Controller Area Network (CAN) transmitter, in which transitions between output levels are smoothed through use of multiple Digital to Analog Converters (DACs) switched by a multi-phase clock signal. Example embodiments include a CAN transmitter (100) comprising: an oscillator (101) configured to generate a clock signal having n equally spaced phases (clk_0, clk_120, clk_240), where n is an integer greater than 1; n Digital to Analog Converters, DACs (102₁₋₃), each DAC having an input connected to one of the n phases of the clock signal and to a common data input line, each DAC being configured to provide an output signal that transitions between first and second output levels in M discrete steps upon being triggered by a transition of a signal on the data input line synchronized with the one of the n phases of the clock signal; and an output amplifier stage (103) configured to provide a differential CAN output signal from a combination of output signals from each of the n DACs (102₁₋₃).

20 Claims, 3 Drawing Sheets

CAN TRANSMITTER

CROSS-REFERENCE TO RELATED APPLICATIONS

This application claims the priority under 35 U.S.C. § 119 of European Patent application no. 21154292.3, filed on 29 Jan. 2021, the contents of which are incorporated by reference herein.

FIELD

The disclosure relates to a Controller Area Network (CAN) transmitter, in which transitions between output levels are smoothed through use of multiple Digital to Analog Converters (DACs) switched by a multi-phase clock signal.

BACKGROUND

CAN transceivers are required to be tolerant to, or robust against, high voltage signals, typically up to around 40 V. The CAN bus signals themselves are differential signals of 2 V, centred at about VCC/2, typically 2.5 V. The common mode voltage can, however, be from −40 V up to +40 V due to electromagnetic interference. For higher bit rate specifications, such as the currently proposed CAN XL specification, a mixed signal architecture may be required. Transistor feature sizes in high voltage mixed signal processes are generally limited in size and frequency, for example a 130 nm process node being limited to synchronous designs up to around 500 MHz. Reduced size process nodes are not yet cost effective for standalone CAN transceivers. A limited clock speed reduces the ability of a CAN transmitter to generate a smoothed transition between output levels, which may be required to limit electromagnetic interference from sharp transitions. It would therefore be advantageous to be able to engineer a desired transition between high and low levels on a CAN transmitter output to reduce electromagnetic interference without requiring more expensive processes.

SUMMARY

According to a first aspect there is provided a CAN transmitter comprising:
an oscillator configured to generate a clock signal having n equally spaced phases, where n is an integer greater than 1;
n Digital to Analog Converters, DACs, each DAC having an input connected to one of the n phases of the clock signal and to a common data input line, each DAC being configured to provide an output signal that transitions between first and second output levels in M discrete steps upon being triggered by a transition of a signal on the data input line synchronized with one of the n phases of the clock signal; and
an output amplifier stage configured to provide a differential CAN output signal from a combination of output signals from each of the n DACs.

An advantage of the CAN transmitter is that the multiple clock phases allow the multiple DACs to operate together with an effective clock frequency that is equal to n times the frequency of the clock signal. This allows for a greater number of discrete steps to be used to transition between the first and second output levels, enabling each transition to be smoother, thereby reducing electromagnetic interference. A further advantage is that the frequency of the step intervals is increased multiple times compared with the frequency of the data being transmitted, thus raising the electromagnetic interference frequency to a different part of the spectrum, which may for example be suppressed by a low pass filter. The effect of this is that electromagnetic interference can be significantly reduced.

Each DAC may be configured to provide the same M discrete steps. The M discrete steps may be graded to be smaller nearer the first and second output levels and larger towards a midpoint between the first and second output levels, thereby approximating a Gaussian shape to each transition of the CAN output signal. Other shaped transitions may also be configured. A generally Gaussian shape for each DAC enables the DACs to operate together to provide an overall smoother transition, since each DAC is triggered sequentially. Which DAC is triggered first does not matter, because each operates identically with the same M discrete steps.

Each DAC may for example comprise a shift register and a plurality of switched resistors for providing the output signal, the shift register storing the M discrete steps for operating the plurality of switched resistors in sequence. Alternative implementations may for example use switched current sources instead of switched resistors. For either implementation, upon triggering the shift register with an input signal transition on the common data input line clocked by one of the clock phases, the shift register operates the plurality of switched resistors or switched current sources in a set sequence to output the M discrete steps in the output signal. Subsequent DACs are then triggered in sequence, providing the same set sequence that combines to provide the CAN output signal.

The number of discrete steps, M, may be an integer of 4 or more. There are no specific restrictions on the value of M, which may be chosen depending on the resolution required. The total number of steps in each transition is a multiple of M and n.

The oscillator may be a ring oscillator, in which the number of clock phases and number of DACs, n, may be an odd number of 3 or more, for example 3, 5, 7, 9 or higher depending on how finely the transition is required to be. An even numbers of clock phases may also be possible using other oscillator topologies that may be capable of providing an even number of clock phases. A higher number will have progressively limited benefit because the identical discrete steps in each DAC results in linear interpolation between each discrete step. A higher number will, however, have the benefit of increasing the frequency of any resulting electromagnetic interference, which may make filtering of such interference easier. Practical implementations using a ring oscillator may have an odd number of phases up to 9. Specific examples may employ a ring oscillator with 3 or 5 clock phases.

The output amplifier stage may typically comprise first and second output transistors configured to provide respective first and second output levels of the differential CAN output signal. Each output transistor may for example be a MOSFET transistor, with the first output transistor being a P-channel MOSFET transistor and the second output transistor being an N-channel MOSFET transistor.

Because the output transistors may need to be driven by a higher voltage signal than may be practical for the DACs, each DAC may comprise a first high side DAC and a second low side DAC, the first high side DAC being configured to provide an output to the first output transistor to drive a first high side of the differential CAN output signal and the second DAC being configured to provide an output to the second output transistor to drive a second low side of the differential CAN output signal. A first level shifter may be provided for each clock phase, each connected between the common data input line and a respective DAC, each first level shifter configured to provide a first high side shifted input signal of the input data signal synchronised by a respective one of the n phases to a corresponding first high side DAC and a second low side shifted input signal of the input data signal synchronised by the respective one of the n phases to a corresponding second low side DAC. A second level shifter may also be connected between each of the n phases of the respective DAC, each second level shifter configured to provide a first high side shifted clock phase to a corresponding first high side DAC and a second low side shifter clock phase to a corresponding second low side DAC.

According to a second aspect there is provided a method of operating a CAN transmitter comprising an oscillator, n Digital to Analog Converters, DACs, n being an integer greater than 1, and an output amplifier stage, the method comprising:

the oscillator generating a clock signal having n equally spaced phases;

each of the n DACs sequentially receiving a respective one of the n phases of the clock signal and a data input signal from a common data input line;

each DAC providing an output signal that transitions between first and second output levels in M discrete steps upon being triggered by a transition of the data input signal synchronized with the one of the n phases of the clock signal; and the output amplifier stage providing a differential CAN output signal from a combination of output signals from each of the n DACs.

The data input signal may be asynchronous with the clock signal from the oscillator.

Other features relating to the first aspect may also apply to the method of the second aspect.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
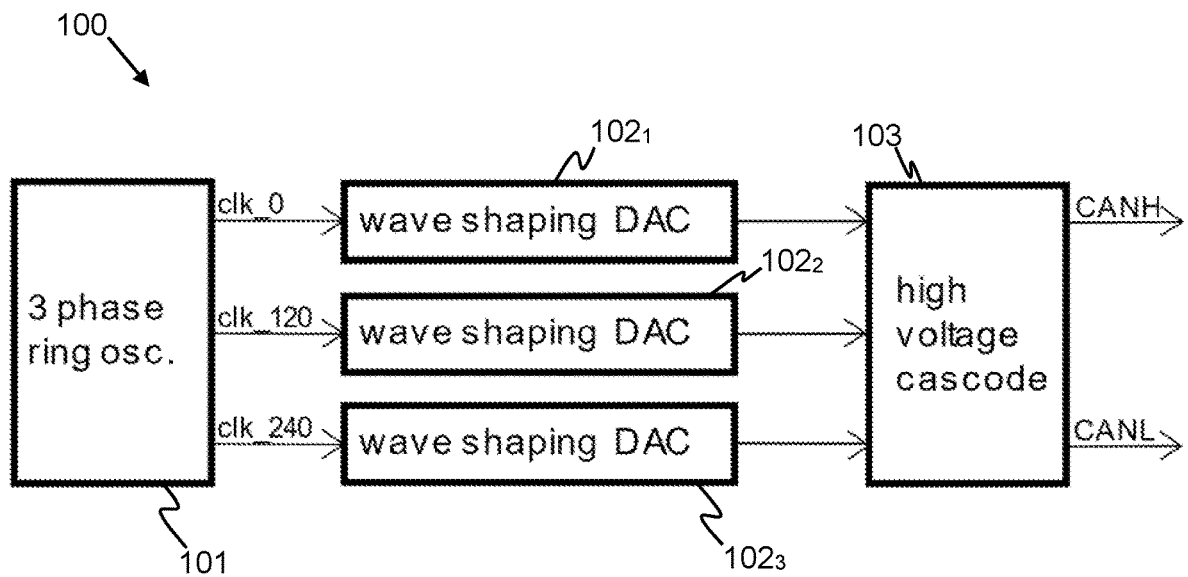
FIG. 1 is a simplified schematic diagram of an example CAN transmitter.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Described herein is a DAC concept conceived to be robust by design and straightforward to implement. The concept is particularly relevant for supporting the increased data rate of CAN XL with faster edge timing, since the existing 2 ns time resolution at 500 MHz of current CAN FD and CAN FD SIC transmitters is not fine grained enough. A time resolution of less than 1 ns is preferably required. A clock signal of over 1 GHz would, however, be prohibitively fast for the digital machine that generates the transmitter DAC control signals. Achieving timing closure may therefore not be possible using existing technology.

Instead of using a single-phase clock, a multi-phase clocking scheme is implemented. The multiple phases may each have a relatively low speed, but the ensemble synthetically generates the required finer timing resolution. A 3-phase clocking scheme may prove to be sufficient and the 3 phases are also easy to generate with a ring oscillator consisting of 3 inverters connected in a ring. The 3-phase clocks, 0/120/240 degrees can be taken directly from the ring oscillator core. By adding 3 DACs in parallel, each clocked with one of the 3-phase clocks, the effective clock speed is raised by 3×.

A clock of 350 MHz may be chosen, resulting in an effective clock of 1050 MHz, ensuring a time resolution just under 1 ns.

To minimise the electromagnetic emission (EME) of the CAN XL transmitter, Gaussian wave shaping is used for transitions from high to low level and vice versa. The Gaussian wave shape combines the fastest possible transition with a narrow bandwidth resulting in minimal spectral emission.

For CAN XL the transition time using three 16-tap DACs is quantised in 48 steps. Repeating the same tap coefficient 3 times results in a good piece-wise linear approximation of the ideal Gaussian wave shape with a resulting low emission spectrum. The 48 steps during a transition can thus be generated by 3 identical parallel 16-tap DACs, each clocked with one of the 3 phases of the ring oscillator. The CAN XL signal is true differential, so the transition is symmetrical from begin to end, resulting in symmetric tap coefficients. A transition progressively accelerates from the onset to the middle and then progressively decelerates towards the end. The steps at the onset of the transition are equally large as at the end of the transition. The 16-tap DAC is thus symmetrical. In total 7 different tap coefficient values may be implemented for a 16-tap DAC. The middle section of the transition can be generated with (unshaped) taps with equal weight.

FIG. 1 illustrates an example of a CAN transmitter 100 comprising a ring oscillator 101, a plurality of DACs $102_{1-3}$ and an output amplifier stage 103. The ring oscillator 101 is in this example a 3 phase ring oscillator, providing clock signals clk_0, clk_120 and clk_240 to respective DACs $102_1$, $102_2$ and $102_3$. The clock signals are equally spaced in phase, which in this example results in phases at 0, 120 and 240 degrees. Each DAC $102_{1-3}$ is a wave shaping DAC, meaning that the output of each DAC has a defined shape in response to an input triggering transition, whether this is a transition from high to low or low to high. The shape of the output signal from each DAC $102_{1-3}$ is predefined and ideally results in an approximation to a Gaussian shape, the closeness of the approximation being dependent on the resolution of the DAC. In a typical example, each DAC $102_{1-3}$ may have 16 taps. The number of taps may vary according to the required implementation, with 4 taps being a realistic minimum to provide a degree of shaping of each transition when using multiple DACs. Each DAC is identically constructed, such that the output waveform is the same. The effect of connecting each DAC to a different clock signal phase is to overlay waveforms that are time shifted relative to each other, thereby effectively increasing the resolution of the output signal.

The output amplifier stage 103 is a high voltage cascode amplifier that provides a differential CAN output signal in the form of a first high level CANH and second low level CANL. The differential CAN output signal is provided to a CAN bus, for example on board a vehicle. The CAN bus may typically need to operate with common mode voltage levels of up to around 40 V, while the differential signal provided by the amplifier 103 is around 2 V. Specific details of the CAN bus and other aspects of the network will be familiar to the skilled person.

Figure 2:
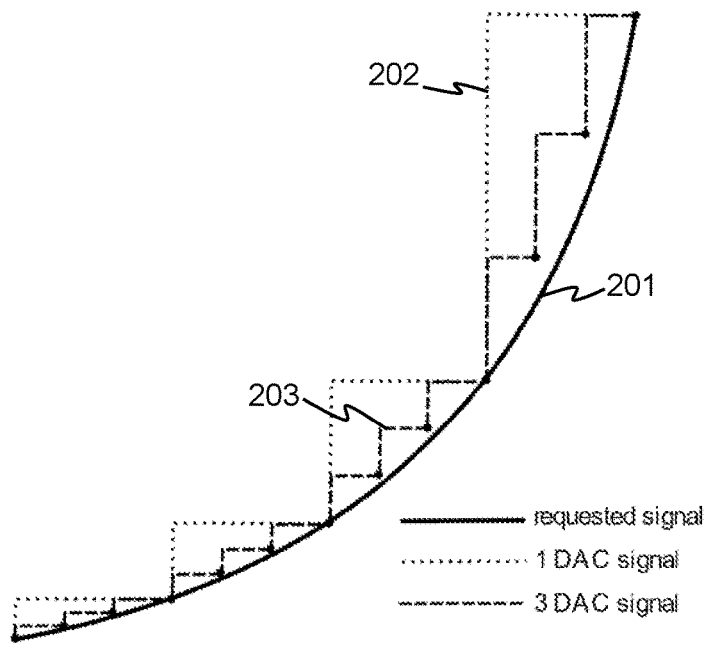
FIG. 2 is a schematic plot of CAN output signal voltage as a function of time.
Figure 3:
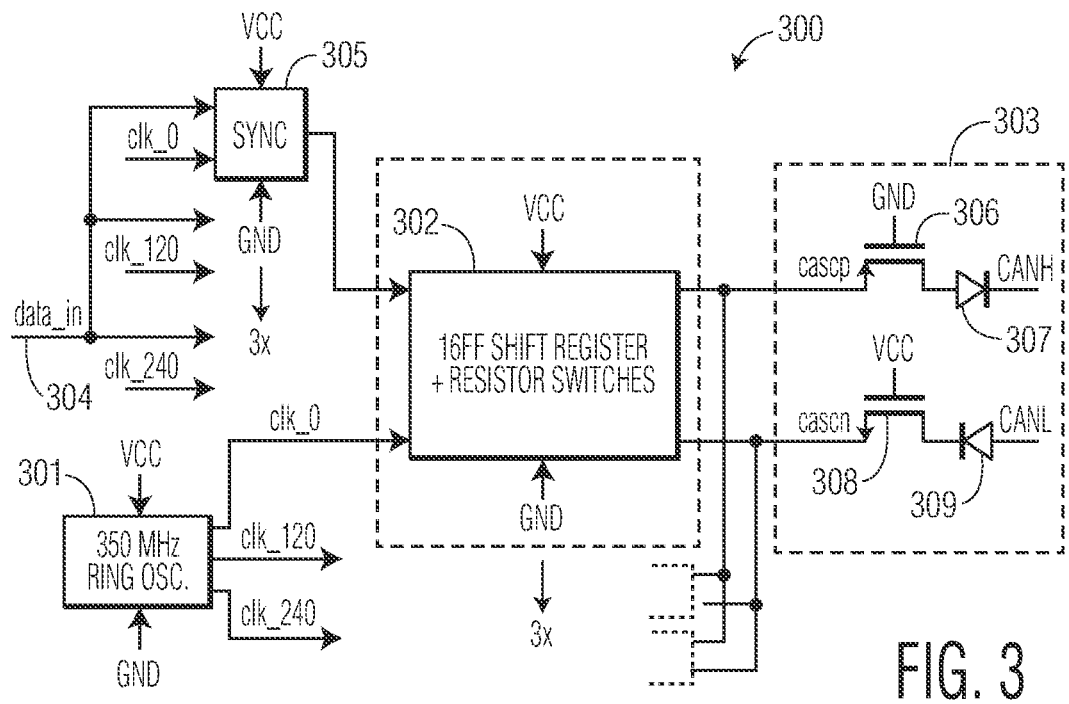
FIG. 3 is a schematic diagram of an example CAN transmitter.

Each DAC $102_{1-3}$ receives a signal from a data input line, shown in more detail in FIG. 3, which is clocked according to the respective phase of the clock signal such that each transition on the data input line is synchronised with the clock signal phases. Upon receiving a transition from the signal on the data input line, which may arrive at any time asynchronous with the clock signal, each DAC begins providing an output waveform according to M predefined discrete steps. An example of an ideal waveform as compared with quantised waveforms output by one and three DACs is shown in FIG. 2. The ideal requested signal 201, of which only a portion is illustrated, follows a Gaussian shape, in which the slope increases towards a maximum at a mid-point of the transition. The start of an example transition is shown in FIG. 2. The requested signal 201 may be approximated with a single DAC output signal 202, in which the size of each step is defined to match the desired level of the requested signal at each interval. The resolution can be increased by combining the outputs from more than one DAC, where the output from each DAC is shifted by a fraction of the step interval in each DAC. In the example shown in FIG. 2, the effect of combining the outputs from three DACs is shown. Because each DAC provides an identical sequence of steps, the steps between each step of the single DAC output 202 linearly interpolate rather than exactly follow the requested signal 201. The effect, however, is nevertheless to reduce the quantisation error of the output signal, as the signal is closer to the requested signal.

As illustrated in the example CAN transmitter 300 in FIG. 3, the three parallel DACs $102_{1-3}$ may each be implemented as shift registers 302, one of which is shown. Each shift register 302 may for example be based on standard logic cells, each driving MOS-switches that activate/de-activate resistors with scaled values according to the tap value from the (quantised) desired Gaussian wave shape. The high level CANH output of the transmitter 100 provided by the output amplifier stage 303 is served by PMOS pull-up switches/resistors and the low level CANL output is served by NMOS pull-down switches/resistors.

Similar to the example in FIG. 1, in the example CAN transmitter 300 illustrated in FIG. 3 a ring oscillator 301 provides a clock signal with three phases clk_0, clk_120, clk_240 to respective DACs 302, one DAC 302 being provided for each of the n phases of the clock signal. A data input signal data_in is provided on a data input line 304 and is synchronized with the clock signal phases with a synchronizer 305 for each phase. Each synchronizer 305, which may be implemented with double cascaded flip-flops, ensures that each transition of the data_in signal is synchronized with each phase of the clock signal provided by the oscillator 301, since the arrival times of transitions in the data_in signal are asynchronous with the clock signal provided by the ring oscillator 301.

The output amplifier stage 303 comprises a P-channel MOSFET 306 driving the high level CANH side of the differential CAN output signal and an N-channel MOSFET 308 driving the low level CANL side of the differential CAN output signal. The P-channel MOSFET has its source connected to a high level output of each of the DACs 302, a gate connected to ground and a drain connected to the CANH output via a first output diode 307. The N-channel MOSFET 308 has its source connected to a low level output of each of the DACs 302, a gate connected to a supply voltage $V_{CC}$ and a drain connected to the CANL output via a second output diode 309. The arrangement of the output amplifier stage 303 results in each side of the output signal being dependent on a sum of the outputs from each of the DACs 302, as the currents provided from each DAC 302 sum together at the inputs of the output amplifier stage 303.

Figure 4:
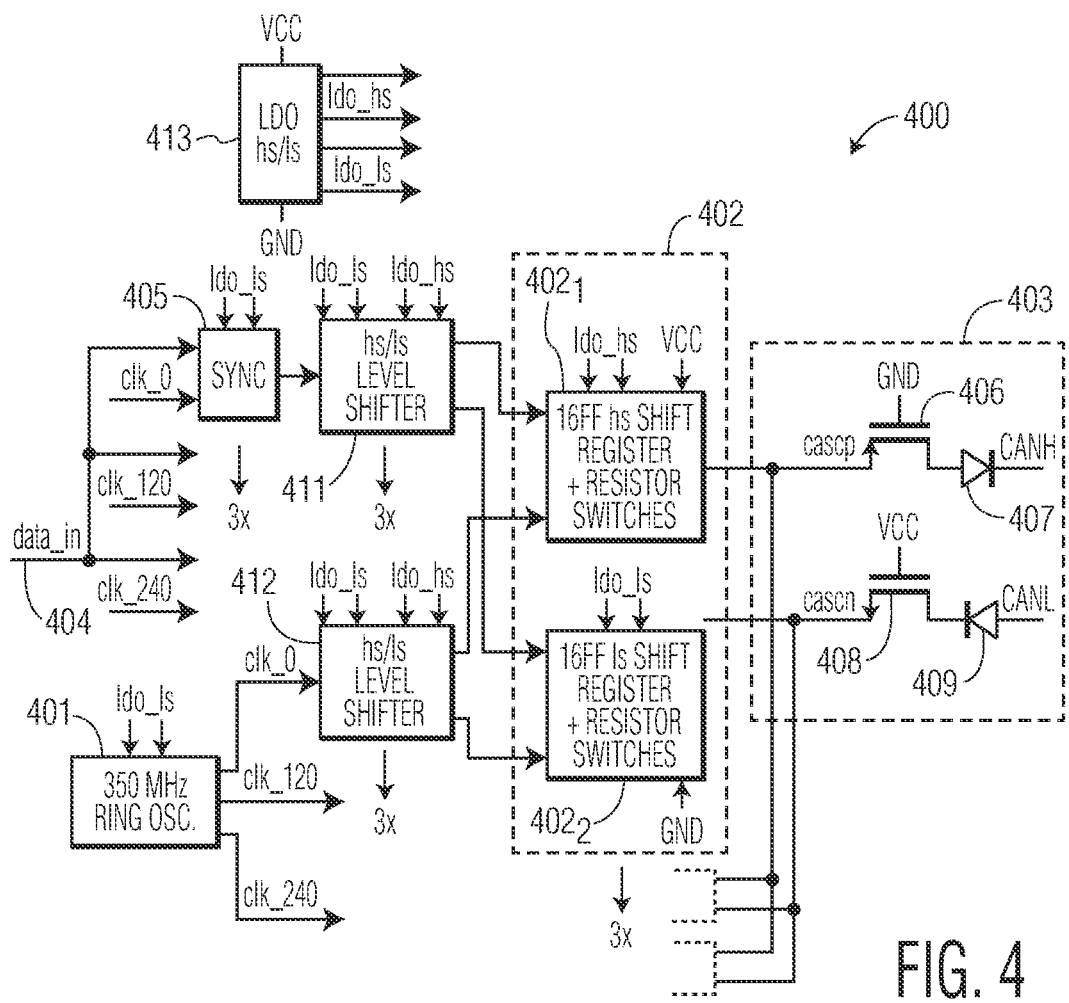
FIG. 4 is a schematic diagram of an example CAN transmitter.

The standard cells in each DAC 302 may have a nominal supply rating of 1.5 V (typical for the process currently used). For the NMOS side these cells can be used directly. This side may be defined as the "low-side". For the PMOS side (termed the "high-side") the standard logic cells may instead refer to the VCC supply rail, which may be at 5.0 V. This voltage may be too high to be directly applied to the standard logic cells. Thus, an extra supply rail of 1.5 V below VCC potential may be required. A dedicated voltage regulator (LDO) may be used to furnish both the low-side supply (1.5 V above ground potential) and the high-side supply (1.5 V below VCC potential). This voltage regulator has two output stages biased from a common reference generator. The low-side output stage consists of NMOS transistors, while the high-side output stage consists of PMOS transistors. In terms of topology the high-side circuit is the same as the low-side circuit. The high-side version can be seen as a "flipped" version of the low-side one, where NMOS and PMOS are interchanged. An example CAN transmitter 400 where low side and high side DACs are implemented is illustrated in FIG. 4. The arrangement is similar to that of FIG. 3, but with each DAC 402 comprising a first high side DAC 402₁, and a second low side DAC 402₂. The first high side DAC 402₁ is configured to provide an output to the high side transistor 406, while the second low side DAC 402₂ is configured to provide an output to the low side transistor 408. The transistors 406, 408 of the output amplifier stage 403 are similarly arranged to those in FIG. 3, with output diodes 407, 409 connecting the transistors 406, 408 to the high and low output levels CANH, CANL providing the differential CAN output signal.

Each DAC 402 is connected to the clock signal phases provided by the ring oscillator 401 and the data input signal data_in on the data input line 404 via first and second high side/low side level shifters 411, 412 for each clock phase. The level shifters 411, 412 and DACs 402₁, 402₂ are provided with high side and low side voltage supplies Ido_hs, Ido_ls by a high side/low side LDO 413, which derives the voltage supplies from supply vcc and ground gnd levels.

Figure 5:
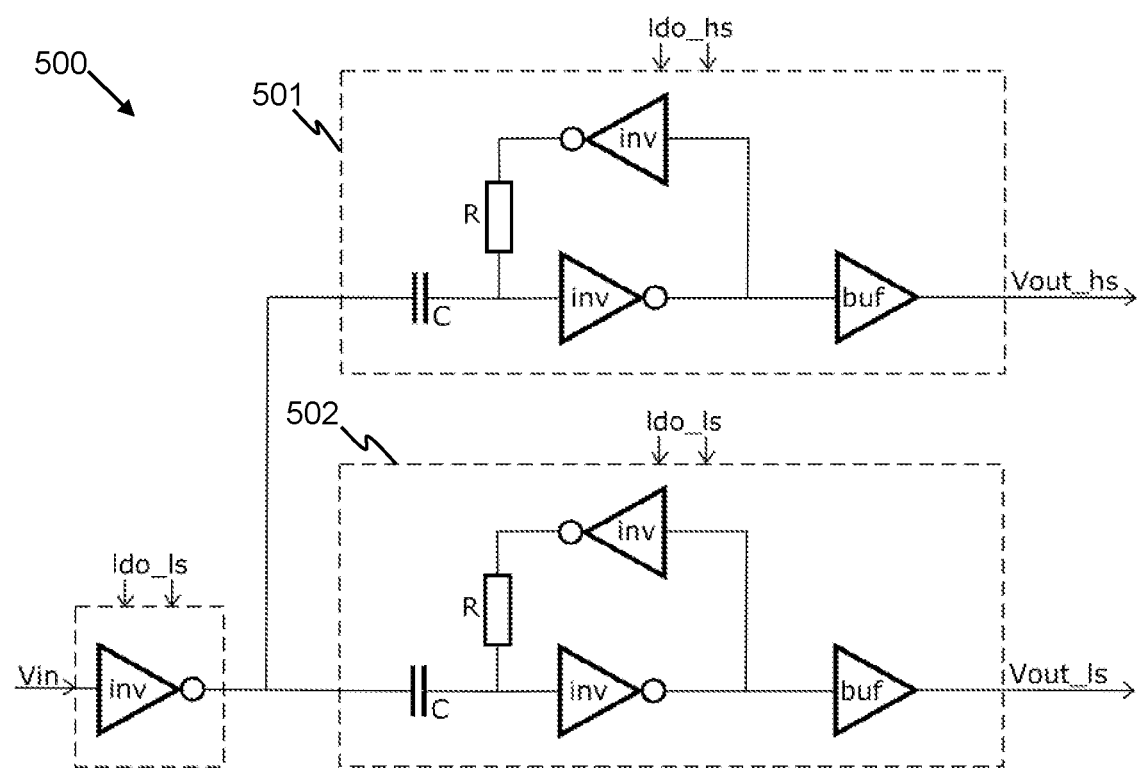
FIG. 5 is a schematic diagram of an example level shifter circuit for the CAN transmitter of FIG. 4.

The data input signal and the 3-phase clock signals originate from "low-side" circuits and thus need to be level shifted to the high-side to drive the high-side shift register of each DAC. An AC-coupled level shifter 500, an example of which is illustrated in FIG. 5, can be used with an internal static level restoration function by means of positive DC feedback that softly latches the new state and thus ensures the steady state of the circuit. This soft positive feed-back is also known as a "bus keeper" circuit, where a weak inverter is employed in the feed-back path of a strong inverter and ensures the steady state in case the input signal goes in tri-state, which is common practice on bus systems. Hence the name "bus keeper". The feedback needs to be weak (soft) so that any intentional signal on the bus can easily change the state of the strong inverter, without being hampered by the bus keeper. The feedback may be made weak by adding a 100 kOhm series resistance (shown as R in FIG. 5). The circuit 500 combines speed (>1 GHz) with quasi static performance (DC). To ensure timing balance between the high-side and low-side shift registers, the same level shifter cell is used for all data and clock signals, whether intended for high-side (actual level shifting towards VCC reference) or low-side, where no level shifting is strictly needed. The timing skew between the high and low side is thus only due to mismatch of the level shifter cells and no other contributions, both paths being identical.

The level shifter circuit 500 in FIG. 5 comprises identical high side and low side level shifters 501, 502, each being decoupled from the input signal Vin by a capacitor C. The capacitor is only required to isolate the higher level DC signal in the high side level shifter 501 but is implemented on both to ensure that the output signals from both level shifters 501, 502 are closely synchronized.

The entire ensemble of DACs can accept an asynchronous data input signal, provided the clock phases clk_0, clk_120 and clk_240 occur in strict sequential order. The synchronizer block 305, 405 before each DAC input ensures synchronization from the arbitrarily arriving data input signal with the locally generated clock signal for each particular DAC instance and propagates the locally synchronized data to the low-side and high-side shift registers $402_1$, $402_2$ by means of the aforementioned AC-coupled level shifter cells 501, 502 of the level shifter circuits 500. The ensemble forms an architecture that is largely robust against clock variations, jitter, frequency drift and other clock-related imperfections.

Although free-running, the frequency of the oscillator 101, 301, 401 can be trimmed on an industrial tester. The trimming process of the ring-oscillator is typically straightforward. Due to the frequency trimming, the transition time of the synthesized wave shape on the CAN bus can be made very precise. The waveform generated in this way can be made to appear close to a wave purely generated by analog means, but with much reduced process spread, supply voltage dependency and temperature drift. The synthesized wave is very stable over the environmental conditions and highly suitable for mass production.

From reading the present disclosure, other variations and modifications will be apparent to the skilled person. Such variations and modifications may involve equivalent and other features which are already known in the art of Controller Area Networks, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A Controller Area Network, CAN, transmitter comprising:
    an oscillator configured to generate a clock signal having n equally spaced phases (clk_0, clk_120, clk_240), where n is an integer greater than 1;
    n Digital to Analog Converters, DACs, each DAC having an input connected to one of the n phases of the clock signal and to a common data input line, each DAC being configured to provide an output signal that transitions between first and second output levels in M discrete steps upon being triggered by a transition of a signal on the data input line synchronized with the one of the n phases of the clock signal; and
    an output amplifier stage configured to provide a differential CAN output signal from a combination of output signals from each of the n DACs.

2. The CAN transmitter of claim 1, wherein each DAC is configured to provide the same M discrete steps.

3. The CAN transmitter of claim 1, wherein the M discrete steps are graded to be smaller nearer the first and second output levels and larger towards a midpoint between the first and second output levels.

4. The CAN transmitter of claim 1, wherein each DAC comprises a shift register and a plurality of switched resistors or switched current sources for providing the output signal, the shift register storing the M discrete steps for operating the plurality of switched resistors or switched current sources in sequence.

5. The CAN transmitter of claim 1, wherein M is an integer of 4 or more.

6. The CAN transmitter of claim 1, wherein the oscillator is a ring oscillator and n is an odd number of 3 or more.

7. The CAN transmitter of claim 1, wherein the output amplifier stage comprises first and second output transistors configured to provide respective first and second output levels of the differential CAN output signal.

8. The CAN transmitter of claim 7, wherein each DAC comprises a first high side DAC and a second low side DAC, the first high side DAC configured to provide an output to the first output transistor to drive a first high level of the differential CAN output signal and the second low side DAC configured to provide an output to the second output transistor to drive a second low level of the differential CAN output signal.

9. The CAN transmitter of claim 8 comprising:
    a first level shifter for each of the n phases of the clock signal, each first level shifter connected between the common data input line and a respective DAC, each first level shifter configured to provide a first high side shifted input signal of the input data signal synchronised by a respective one of the n phases to a corresponding first high side DAC and a second low side shifted input signal of the input data signal synchronised by the respective one of the n phases to a corresponding second low side DAC; and
    a second level shifter connected between each of the n phases of the clock signal and a respective DAC, each second level shifter configured to provide a first high side shifted clock phase to a corresponding first high side DAC and a second low side shifted clock phase to a corresponding second low side DAC.

10. The CAN transmitter of claim 2, wherein the M discrete steps are graded to be smaller nearer the first and second output levels and larger towards a midpoint between the first and second output levels.

11. The CAN transmitter of claim 2, wherein each DAC comprises a shift register and a plurality of switched resistors or switched current sources for providing the output signal, the shift register storing the M discrete steps for operating the plurality of switched resistors or switched current sources in sequence.

12. The CAN transmitter of claim 2, wherein M is an integer of 4 or more.

13. The CAN transmitter of claim 2, wherein the oscillator is a ring oscillator and n is an odd number of 3 or more.

14. The CAN transmitter of claim 2, wherein the output amplifier stage comprises first and second output transistors configured to provide respective first and second output levels of the differential CAN output signal.

15. A method of operating a CAN transmitter comprising an oscillator, n Digital to Analog Converters, DACs, n being an integer greater than 1, and an output amplifier stage, the method comprising:

generating by the oscillator a clock signal having n equally spaced phases;

sequentially receiving by each of the n DACs a respective one of the n phases of the clock signal and a data input signal from a data input line;

providing by each DAC an output signal that transitions between first and second output levels in M discrete steps upon being triggered by a transition of the data input signal synchronized with the one of the n phases of the clock signal; and providing by the output amplifier stage a differential CAN output signal from a combination of output signals from each of the n DACs.

16. The method of claim 15 wherein the data input signal is asynchronous with the clock signal from the oscillator.

17. The method of claim 15, wherein the M discrete steps are graded to be smaller nearer the first and second output levels and larger towards a midpoint between the first and second output levels.

18. The method of claim 15, wherein the oscillator is a ring oscillator and n is an odd number of 3 or more.

19. The method of claim 15, wherein n is an even number.

20. The method of claim 15, wherein M is an integer of 4 or more.

* * * * *